United States Patent
Feiweier

(10) Patent No.: US 9,952,302 B2
(45) Date of Patent: Apr. 24, 2018

(54) METHOD AND MAGNETIC RESONANCE APPARATUS FOR SUPPRESSING UNDESIRED COHERENCE PATHWAYS

(71) Applicant: Siemens Aktiengesellschaft, Munich (DE)

(72) Inventor: Thorsten Feiweier, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 504 days.

(21) Appl. No.: 14/683,581

(22) Filed: Apr. 10, 2015

(65) Prior Publication Data
US 2015/0293202 A1 Oct. 15, 2015

(30) Foreign Application Priority Data
Apr. 10, 2014 (DE) .................. 10 2014 206 929

(51) Int. Cl.
| | | |
|---|---|---|
| *G01V 3/00* | (2006.01) | |
| *G01R 33/565* | (2006.01) | |
| *G01R 33/483* | (2006.01) | |
| *G01R 33/561* | (2006.01) | |
| *G01R 33/563* | (2006.01) | |

(52) U.S. Cl.
CPC ........ *G01R 33/565* (2013.01); *G01R 33/4838* (2013.01); *G01R 33/5616* (2013.01); *G01R 33/5659* (2013.01); *G01R 33/56341* (2013.01)

(58) Field of Classification Search
CPC .............. G01R 33/34; G01R 33/34007; G01R 33/3635; G01R 33/48; G01R 33/4818; G01R 33/481; G01R 33/4824; G01R 33/446; G01R 33/4835; G01R 33/4828; G01R 33/54; G01R 33/543; G01R 33/565; G01R 33/5611; G01R 33/5612; G01R 33/583; G01R 33/5659; G01R 33/56518; G01R 33/56536; G01R 33/56572;
(Continued)

(56) References Cited

U.S. PATENT DOCUMENTS

| 5,758,646 A * | 6/1998 | Van Der Meulen ... G01R 33/54 324/309 |
| 6,369,568 B1 * | 4/2002 | Ma .................... G01R 33/56554 324/307 |

(Continued)

OTHER PUBLICATIONS

Heid, "Eddy Current-Nulled Diffusion Weighting", Proc. Intl. Soc. Mag. Reson. Med., vol. 8, p. 799,( 2000).

(Continued)

*Primary Examiner* — Thang Le
(74) *Attorney, Agent, or Firm* — Schiff Hardin LLP

(57) ABSTRACT

In a method and apparatus for recording MR signals with an image-recording sequence with which preparation gradients for preparing the MR signals are switched before the signal readout and readout gradients, in order to predominantly record the MR signal components with a desired signal coherence pathway in the readout segment, the signal components with an undesired signal coherence pathway are suppressed by dephasing gradients. The dephasing gradients are determined independently of the time intervals in which the preparation gradients are switched, and only in dependence on the effective size of the gradient moments of the preparation gradients.

16 Claims, 3 Drawing Sheets

(58) Field of Classification Search
CPC .......... G01R 33/5614; G01R 33/56509; G01R 33/341; A61B 5/0555
USPC .................................................. 324/300–322
See application file for complete search history.

(56) References Cited

U.S. PATENT DOCUMENTS

| | | | |
|---|---|---|---|
| 7,633,291 B2* | 12/2009 | Zwanger | G01R 33/56341 324/307 |
| 8,030,920 B2* | 10/2011 | Vu | G01R 33/288 324/307 |
| 2007/0167732 A1 | 7/2007 | Zwanger | |
| 2010/0277169 A1 | 11/2010 | Feiweier | |
| 2012/0268121 A1* | 10/2012 | Hernando | G01R 33/50 324/309 |
| 2013/0063144 A1 | 3/2013 | Feiweier | |
| 2013/0088228 A1 | 4/2013 | Feiweier et al. | |
| 2014/0035577 A1* | 2/2014 | Blumhagen | G01R 33/543 324/309 |
| 2014/0091797 A1 | 4/2014 | Feiweier | |
| 2014/0232396 A1* | 8/2014 | Grodzki | G01R 33/543 324/309 |

OTHER PUBLICATIONS

Reese et al .Reduction of Eddy-Current-Induced Distortion in Diffusion MRI Using a Twice-Refocused Spin Echo, in: Magnetic Resonance in Medicine, vol. 49, pp. 177-182, (2003).

Nagy et al. "Orthogonalizing Crusher and Diffusion-Encoding Gradients to Suppress Undesired Echo Pathways in the twice-Refocused Spin Echo Diffusion Sequence" in Magnetic Resonance in Medicine; vol. 71; pp. 506-515, (2014).

* cited by examiner

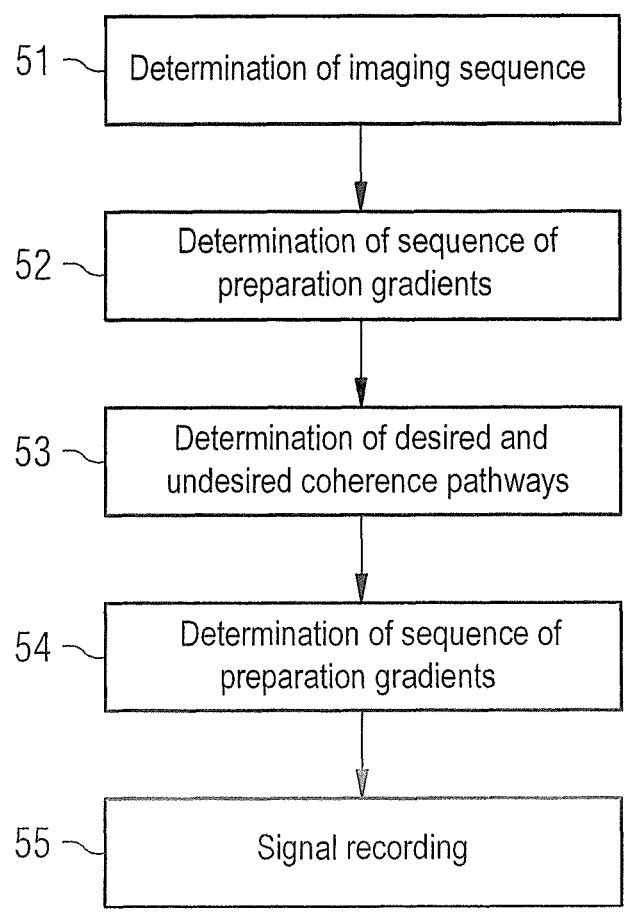

METHOD AND MAGNETIC RESONANCE APPARATUS FOR SUPPRESSING UNDESIRED COHERENCE PATHWAYS

BACKGROUND OF THE INVENTION

Field of the Invention

The present invention relates to a method for recording MR signals with an image-recording sequence, wherein undesired signal coherence pathways are suppressed. The invention also relates to a magnetic resonance apparatus designed to implement such a method.

Description of the Prior Art

MR imaging has become established as an important diagnosis method in recent decades. For the creation of MR images, a number of different sequences of RF and gradient pulses are used to generate the desired image contrast in each case. A special sequence is the twice-refocused spin echo sequence, also known as double spin echo sequence, that has one RF excitation pulse and two RF refocusing pulses. After each RF pulse, gradients are switched with moments that are, for example, effective for contrast generation or preparation or for spatial encoding.

Twice-refocused spin echoes are used for example for diffusion imaging with the suppression of residual eddy-current fields. A further field of application is spatial localization when slice selection gradients are switched on different axes with each RF pulse. This enables image volumes restricted to one, two or three dimensions to be excited. In addition, twice-refocused spin echoes can be of interest in the presence of inhomogeneous B1 fields since quadratic-phase adiabatic RF pulses can be used for refocusing. Phase dispersion along the slice normals can be cancelled simply by the use of two suitable adiabatic pulses. A further possibility for the use of double spin echoes is in the environment of spectroscopic imaging (PRESS (Point RESolved Spectroscopy)).

One challenge with the use of multiple RF pulses is the high number of coherence pathways that are thereby generated. Unavoidable spatial variations of the B1 field can have different impacts on an RF pulse. For example, each RF pulse that is radiated can act on coherences in the form of excitation, refocusing, storage or restoration. In addition to the desired double spin-echo coherence, the following potentially interfering signal pathways occur with RF pulses: three FID signals (full induction decay), three spin echoes, one stimulated echo and one antistimulated echo.

Numerous methods for suppressing all undesired coherence pathways are known for twice-refocused echoes for diffusion imaging, for example from US 2007/0167732 A1, DE 10 2011 005 084 B3 or DE 10 2009 019 895 A1. In particular, in DE 10 2011 005 084 B3, these disclosures are restricted to a special case involving the use of diffusion-encoding gradients and cannot be transferred to the generalized case of twice-refocused spin echoes. In addition, the only case considered is one in which diffusion gradients are applied during the entire duration of the preparation. Variants with pauses between diffusion gradients, which would be necessary for more flexible diffusion encoding, are not possible.

The known spoiler schemes for spectroscopic localization by means of twice-refocused spin echoes also only resolve the problem for a special case with defined gradient moments on the three axes. In addition, individual signal pathways are only suppressed along one coordinate axis in each case resulting in higher dephasing moments for each axis associated with higher gradient amplitudes and/or longer pulse durations and urgently requiring dephasing on all axes.

A further method for suppressing undesired coherence pathways entails the use of phase cycles. In this case, a measurement is repeated many times with different RF pulse phases and the signals recorded are added complexly. Here, the desired signal pathway is constructively amplified while the undesired coherence pathways are destructively extinguished. However, an approach of this kind is very sensitive to temporal variations and instabilities, caused, for example, by the movement of the person being examined.

SUMMARY OF THE INVENTION

An object of the present invention is to minimize undesired signal coherence pathways, wherein more flexibility with respect to the switching of preparation gradients used for preparing the MR signal is desired.

This object is achieved by a method in accordance with the invention, for recording MR signals with an image-recording sequence, having a time interval in which multiple preparation gradients for preparing a MR signal are switched before the signal readout, and a readout segment with readout gradients for reading out the MR signals. RF pulses of the image-recording sequence generate MR signal components with a desired signal coherence pathway and MR signal components with undesired signal coherence pathways. The signal components with a desired signal coherence pathway are predominantly recorded in the readout segment. According to the method, the MR signal components of the undesired signal coherence pathways for the image-recording sequence used are determined and dephasing gradients are switched to reduce the recording of the MR signal components with undesired signal coherence pathways. Here, the dephasing gradients are determined taking into account the preparation gradients that are used, as well as the undesired signal coherence pathways, such that the MR signal components with undesired signal coherence pathways are reduced by the gradient moments of the dephasing gradients being determined so that the dephasing gradient moment for each undesired signal coherence pathway is greater than a threshold value. The dephasing gradients are determined independently of the time intervals in which the preparation gradients are switched and the calculation is only performed in dependence on the effective size of the gradient moments of the preparation gradients.

The aforementioned method has the advantage that temporal flexibility with the switching of the preparation gradients is possible so that the field of application is not restricted to diffusion measurements only. Furthermore, the determination is performed independently of the time intervals, i.e. of the length of the time intervals, in which the preparation gradients are switched.

The preparation gradients can be used for diffusion measurements. For example, the preparation gradients can also be used with spectroscopy imaging sequences such as single voxel measurements or CSI (chemical shift imaging) measurements. The effective gradient moments generated by the preparation gradients can be used for diffusion or also for other types of encoding, for example spatial decoding.

When the recording module is, for example, an EPI acquisition, before the start of the EPI trajectory it is necessary to apply a gradient moment in the readout and phase encoding direction in each case. This shifts the "start position" of the recording to the desired location in the k-space. These pre-dephasing gradients can in principle be applied at any time—i.e. between excitation and first refocusing or between the two refocusings or after the second refocusing.

A further example is the slice selection gradient. Both the excitation pulse and the two refocusing pulses are applied with the simultaneous application of slice selection gradients. The associated gradient moments are to be assigned to the respective effective moments. For example, the slice selection gradient moment from the center to the end of the excitation pulse is assigned to the effective moment between excitation and first refocusing.

Preferably, the image-recording sequence is a double spin-echo sequence with one RF excitation pulse and two RF refocusing pulses. At least one first preparation gradient with a first effective gradient moment is switched between the RF excitation pulse and the first RF refocusing pulse, wherein at least one second preparation gradient with a second effective gradient moment is switched between the two RF refocusing pulses and after the second RF pulse a third preparation gradient with a third effective gradient moment is switched. Preferably, the dephasing gradients are only determined in dependence on the size of two of the gradient moments relative to one another, i.e. in dependence on the size of the first moment relative to the size of the second moment or of the first moment relative to the third moment etc. Each of the moments can also have the size zero if further other preparation gradients with further effective gradient moments are switched. This means that the effective size of the first gradient moment and the effective size of the second gradient moment are the criteria for the determination of the dephasing gradients. In this case, the time required in order to switch these preparation gradients is irrelevant for the purposes of the calculation.

Starting from the first effective gradient moment and the second effective gradient moment, a number of different cases is now possible. A first determination of the dephasing gradients can be performed for a case in which the second effective gradient moment is more than twice the size of the first effective gradient moment. Another determination of the dephasing gradients is possible in a case in which the second effective gradient moment is smaller than twice the first effective gradient moment. A further case relates to a case in which the first effective gradient moment is greater than the second effective gradient moment. In a further case, during the determination of the dephasing gradients, half of the first effective gradient moment, i.e. the half first effective gradient moment, is greater than the second effective gradient moment. A further determination is possible for a case in which the second effective gradient moment is <0.

This applies in the special case of M0≥0. The case of M0<0 is obtained simply by changing the +/− signs.

Generally, the individual effective gradient moments do not have to be generated by a single gradient, it is also possible for an effective gradient moment of a preparation gradient to be achieved by two or more chronologically separate gradient circuits.

The invention furthermore concerns a magnetic resonance apparatus that has an image sequence controller, which, as described above, determines the dephasing gradients.

BRIEF DESCRIPTION OF THE DRAWINGS

FIG. 4 is a flowchart of the basic steps for the determination of the dephasing gradients during the signal recording according to the invention.

DESCRIPTION OF THE PREFERRED EMBODIMENTS

Figure 1:
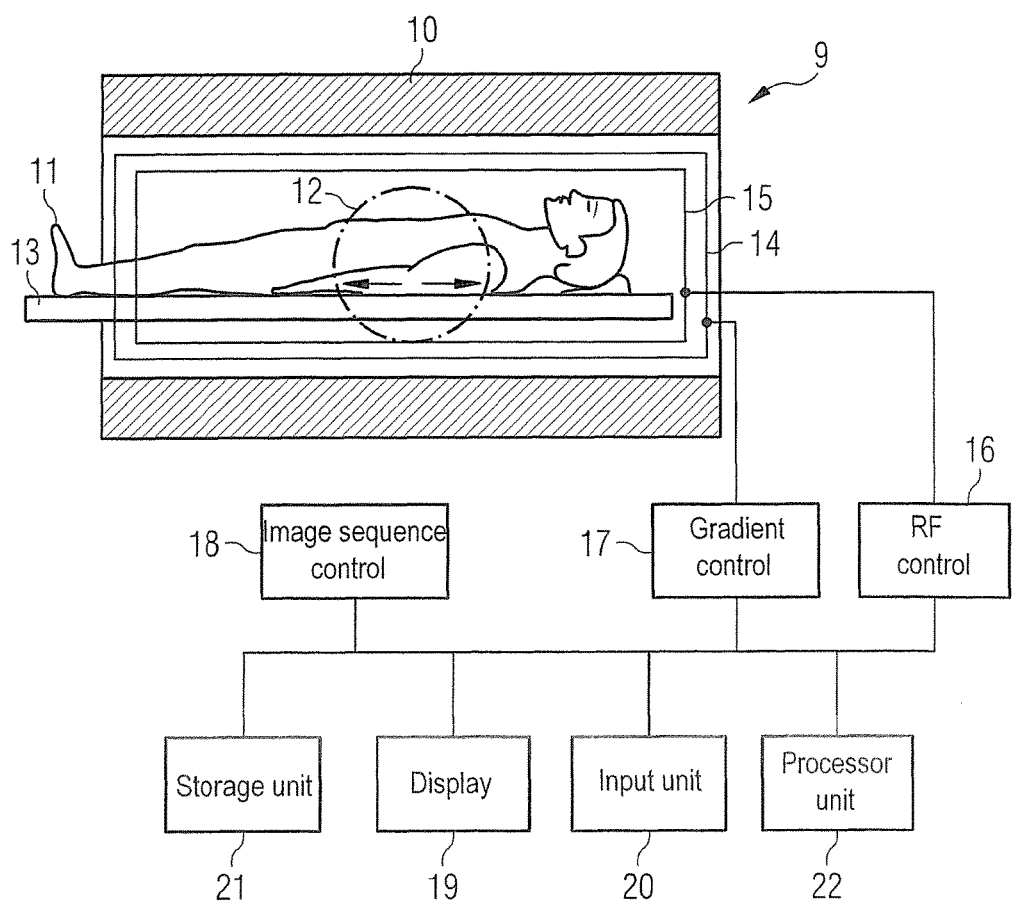
FIG. 1 is a block diagram of an MR apparatus for recording MR signals with which an image sequence control is embodied to switch the dephasing gradients such that undesired signal coherence pathways are suppressed.

FIG. 1 is a block diagram of a magnetic resonance apparatus 9, which is designed for recording (acquiring) magnetic resonance signals. The magnetic resonance apparatus 9 has a scanner with a magnet 10 for generating a polarization field B0. An object to be examined, here a person 11, is introduced into the magnet 10 in order to record MR signals from the person 11 in a target region 12. Here, the person 11 can lie on a movable table 13. The MR scanner furthermore has a gradient coil arrangement 14 for generating magnetic field gradients. For the excitation a magnetization of nuclear spins in the target region with respect to the B0 field, a radio-frequency arrangement 15 is provided that is able to irradiate an RF field into the person 11 in order to deflect the magnetization from the equilibrium position. The RF arrangement 15 can generate, for example, one 90° pulse and two 180° refocusing pulses with an RF coil, or multiple RF coils, of the RF arrangement 15. An RF control 16 is provided to control the RF coils. A gradient control 17 is provided for the control of the magnetic field gradients. An image sequence controller 18 is provided, which, in dependence on the selected image-recording sequence, controls the sequence of the irradiated RF pulses and magnetic field gradients and hence also controls the RF control 16 and the gradient control 17. As explained in detail below, the image sequence controller 18 can determine dephasing gradients such that undesired signal coherence pathways are reduced or suppressed during the signal recording. MR images can be displayed on a display unit 19 or an operator can plan a measurement in that, for example, the imaging volume is defined on a display unit via an input unit 20. It is possible, for example, for prespecified imaging sequences or other programs used to operate the MR system to be stored in a memory unit 21. A central processor 22 can control the magnetic resonance system. The general manner of operation of such a magnetic resonance apparatus 9 is known to those skilled in the art and thus need not be explained in more detail herein.

Furthermore, the units shown in FIG. 1 as different units do not have to be implemented as separate units as shown. The individual units can also be combined by hardware, software or a combination of hardware and software.

Figure 2:
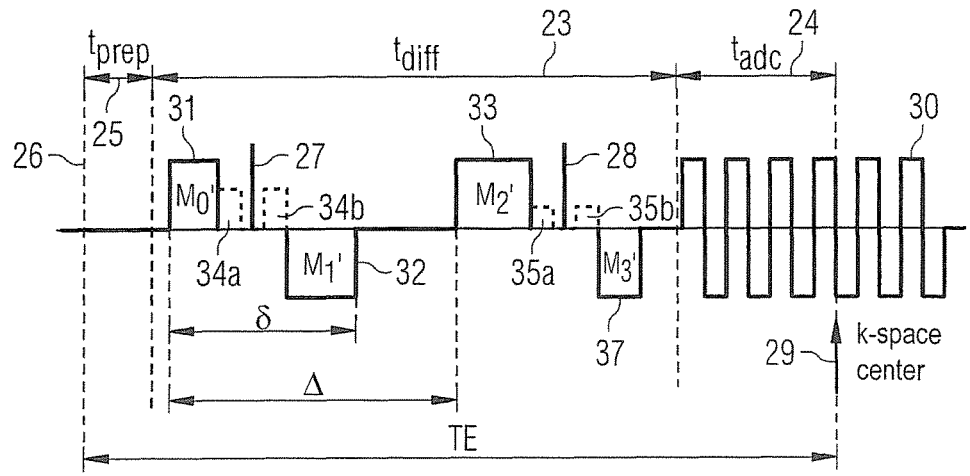
FIG. 2 shows a portion of a sequence for recording a diffusion-weighted MR signal with the inventive switching of dephasing gradients.

The image sequence controller 18 is now embodied such that an image-recording sequence can be performed as shown in a partial section in FIG. 2. Here, the calculation of the dephasing gradients can be performed in the image sequence control 18 or processor unit 22.

FIG. 2 explains the temporal course of a diffusion-weighted image-recording sequence, wherein the image-recording sequence includes a diffusion section $t_{diff}$ 23, a readout section $t_{adc}$ 24 and a preparation section $t_{prep}$ 25. The radiation of a 90° excitation pulse 26 is followed by a first refocusing pulse 27 and a second refocusing pulse 28. After an echo time TE following the radiation of the 90° pulse, this results in an echo signal 29 with a maximum at the time indicated by the arrow. The signal recording (acquisition) starts a time interval $t_{adc}$ before reaching the signal maximum. As can be seen from the switching of the readout gradients 30, the signal readout is performed with the use of the echo planar technique. The gradients for slice selection and phase encoding, which are also required, are not shown for simplicity and correspond to those used with gradient switching in a double spin-echo imaging aging sequence of this kind. The signal readout takes place beyond the time interval $t_{adc}$ wherein the recording of k-space is continued until the necessary coverage of k-space with raw data is achieved. With the echo planar technique, the signal readout extends beyond the time interval $t_{adc}$ so that, during the time interval $t_{adc}$, only a part of k-space, or the raw-data domain, is filled with raw data. In the ideal case, this is the first half of the raw-data domain, so that the spin echo precisely coincides with the recording of the k-space center. However, the invention is not restricted to the echo planar technique.

Preparation or diffusion gradients are now switched in the diffusion section 23, for example the gradient $M_0'$ 31, which generates an effective gradient moment M0 (see FIG. 3), the gradient $M_1'$ 32, and the gradient $M_2'$ 33, which together generate an effective gradient moment M1, and a gradient $M_3'$ 37 with an effective gradient moment M2. Due to the radiated RF pulses 26, 27 and 28, in addition to the desired signal coherence pathway resulting in the echo signal 29, undesired signal coherence pathways also occur. Since a 90° excitation pulse does not align all excited nuclear spins by precisely 90° or a 180° refocusing pulse does not refocus all nuclear spins by 180°, each RF pulse has an excitation component and a refocusing component which then result in the undesired signal coherence pathways. These additional undesired signal coherence pathways are reduced by the switching of additional dephasing gradients. These additional dephasing gradients are switched in pairs by the respective 180° pulses, i.e. the dephasing gradients 34a and 34b, which are switched by the refocusing pulse 27 and the dephasing gradients 35a and 35b, which are switched by the second refocusing pulse 28. These additional dephasing gradients cause the MR signals of the undesired signal coherence pathways to be dephased so that their influence on the signal recording can be reduced.

The switching of additional dephasing gradients should suppress the signal coherence pathways of the stimulated echoes, simple spin echoes and the FIDs. The switching in pairs at short temporal intervals minimizes the influence of the dephasing gradients on the diffusion encoding. In the exemplary embodiment shown in FIG. 2, temporal flexibility of the individual preparation or diffusion gradients is possible. The temporal distance between the start of the first preparation gradient 31 and the end of the second preparation gradient is $\delta$, while the temporal distance from the start of the first preparation gradients to the start of the third one is $\Delta$. There is a temporally variable pause ($\Delta-\delta$) between the preparation gradient 32 and the preparation gradient 33. For example, it can be necessary to determine additional information on the tissue microstructure. This requires the ability to change the diffusion encoding or decoding and the associated time intervals $\delta$ and their separation $\Delta$ independently of other imaging parameters, for example independently of the echo time TE. This means that $\Delta-\delta$ is not fixed in time, but can be varied.

As explained in detail below, the length of the duration of the individual gradient circuits 31, 32, 33 or 37 is not relevant for the determination of the dephasing gradients 34a, 34b, 35a and 35b.

Figure 3:
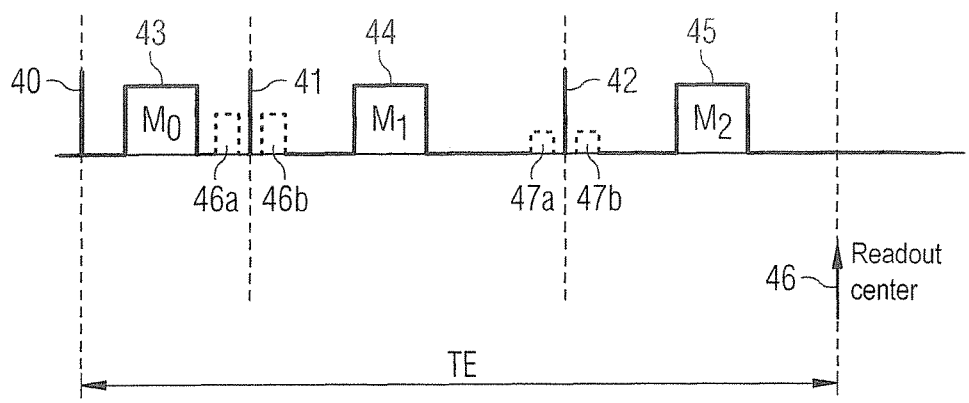
FIG. 3 shows a portion of another sequence for recording MR signals with dephasing gradients according to the invention.

FIG. 3 shows the general case in which the respective effective gradient moments M0, M1, M2 are used, which do not necessary have to be diffusion gradients. Furthermore, the individual gradient moments can be generated by any number of gradient pulses on a given axis. FIG. 3 shows the excitation pulse 40 and the two refocusing pulses 41 and 42. Also shown are the preparation gradients 43, 44 and 45. The preparation gradients have the gradient moments M0, M1 and M2, wherein, as mentioned, the individual gradient moments M0, M1 or M2 can be generated by any number of gradient pulses in a respective direction. The desired spin echo in turn takes place after a time interval TE after the excitation pulse 40 as a double spin-echo signal 46. For the determination of dephasing efficiency, it is necessary for all coherence pathways relative to the accumulated gradient moment to be determined. Depending on the implicit dephasing, which was generated by the three gradient moments M0, M1 and M2, additional explicit dephasing may, or may not, be necessary. A threshold value $M_{spoil}$ defining a minimum dephasing moment can, for example, depend upon the voxel size or the current moments of the imaging gradients. As shown in FIG. 2, dephasing gradient pairs, such as the gradient pairs 46a and 46b and 47a and 47b, can be switched by the two refocusing pulses. Each dephasing gradient of the first pair has a gradient moment $M_A$, while each of the second dephasing gradients has a gradient moment $M_B$ which is necessary in order to suppress the undesired signal coherence pathways. Similarly to the case with the preparation gradients, only the effective moment is decisive for the dephasing gradients. It is specified for the equations 1a to 1i shown below that the desired dephasing gradient moment for the desired double spin-echo should be zero, while for the undesired signal coherence pathways is should be greater than a threshold value, the threshold value $M_{spoil}$. For example, a dephasing gradient can be composed of numerous individual gradient pulses. Neither does the gradient pair $M_A$ have to consist of identical gradient pulses—only the moment has to be identical. The temporal position of the dephasing gradients is also in principle arbitrary—the only factor that matters is the assignment before, between and after the refocusing pulses. In addition to the desired double spin-echo described with equation 1i, there are three FID signals, three spin-echo signals, one stimulated spin echo and one antistimulated spin echo with the equations 1a-1h:

$$|M_0+M_A+M_A+M_1+M_B+M_B+M_2| \geq M_{spoil} \quad (1a)$$

$$|M_A+M_1+M_B+M_B+M_2| \geq M_{spoil} \quad (1b)$$

$$|M_B+M_2| \geq M_{spoil} \quad (1c)$$

$$|M_0+M_A-M_A-M_1-M_B-M_B-M_2| \geq M_{spoil} \quad (1d)$$

$$|M_0+M_A+M_A+M_1+M_B-M_B-M_2| \geq M_{spoil} \quad (1e)$$

$$|M_A+M_1+M_B-M_B-M_2| \geq M_{spoil} \quad (1f)$$

$$|M_0+M_A-M_B-M_2| \geq M_{spoil} \quad (1g)$$

$$|M_0+M_A+M_B+M_2| \geq M_{spoil} \quad (1h)$$

$$M_0+M_A-M_A-M_1-M_B+M_B+M_2=0 \quad (1i).$$

If now according to equation 1i, $M_2=M_1-M_0$, this results directly in the following equations:

$$|M_0-2M_1-M_A-2M_B| \geq M_{spoil} \quad (2a)$$

$$|M_0-M_1-M_B| \geq M_{spoil} \quad (2b)$$

$$|M_0+M_A|\geq M_{spoil} \quad (2c)$$

$$|2M_0-M_1+M_A-M_B|\geq M_{spoil} \quad (2d)$$

$$|M_1+M_A+M_B|\geq M_{spoil} \quad (2e).$$

If now $M_A$ and $M_B=0$ is set, the parameter ranges in which the implicit dephasing with $M_0$, $M_1$ and $M_2$ is sufficient in order to suppress the undesired signal coherence pathways can be identified:

$$|M_0-2M_1|\geq M_{spoil} \quad (3a)$$

$$|M_0-M_1|\geq M_{spoil} \quad (3b)$$

$$|M_0|\geq M_{spoil} \quad (3c)$$

$$|2M_0-M_1|\geq M_{spoil} \quad (3d)$$

$$|M_1|\geq M_{spoil} \quad (3e).$$

These conditions are simultaneously fulfilled if the following applies:

$$M_0\geq 2M_1+M_{spoil} \text{ and } |M_1|\geq M_{spoil}(M_0>0) \quad (4a)$$

or $$M_0\leq 2M_1-M_{spoil} \text{ and } |M_1|\geq M_{spoil}(M_0<0) \quad (4b).$$

With reference to FIGS. 2 and 3 and the suppression of the undesired coherence pathways, two pairs of dephasing gradients with gradient moments $M_A$ and $M_B$ can also correspond to three dephasing gradients with moments $M_I$, $M_{II}$, $M_{III}$, which are applied after each RF pulse with $M_I=M_A$, $M_{II}=M_A+M_B$ and $M_{III}=M_B$. $M_{II}=M_A+M_B$ is necessary in order to compensate the additional dephasing moments along the desired turbo spin-echo coherence pathway since $M_I-M_{II}+M_{III}=0$.

For the parameter sets which do not fulfill any of the implicit dephasing conditions, explicit dephasing with the aid of the dephasing gradients using $M_A$, $M_B\neq 0$ is necessary. On the basis of the inequalities 2, suitable dephasing gradient combinations are subsequently determined. Due to the linear occurrence of all gradient moments in the equations, it is sufficient to consider the case with $M_0\geq 0$. Solutions for the case $M_0<0$ are obtained in that the polarity of the dephasing moments $M_A$ and $M_B$ is reversed.

The following differentiates between different cases, wherein each case means a special dephasing scheme. As will be shown in the following, these cases only depend upon the relation of the effective gradient moments $M_1$ and $M_0$. The length of the individual switchings of the dephasing gradients, i.e. the time intervals for the switching of $M_0$, $M_1$ or $M_2$ or the size of $M_3$, are not themselves important.

Case 1: $M_1\geq 2M_0\geq 0$:

$$|Y_1-M_A-2M_B|\geq M_{spoil} \quad (5a)$$

$$|Y_2-M_B|\geq M_{spoil} \quad (5b)$$

$$|X_1+M_A|\geq M_{spoil} \quad (5c)$$

$$|Y_3+M_A-M_B|\geq M_{spoil} \quad (5d)$$

$$|X_2+M_A+M_B|\geq M_{spoil} \quad (5e),$$

where $X_i\geq 0$ and $Y_i\leq 0$. This results in a first special solution:

$$M_A=M_{spoil} \quad (6a)$$

$$M_B=2M_{spoil} \quad (6b).$$

Case 2: $2M_0>M_1\geq M_0$:

$$|Y_1-M_A-2M_B|\geq M_{spoil} \quad (7a)$$

$$|Y_2-M_B|\geq M_{spoil} \quad (7b)$$

$$|X_1+M_A|\geq M_{spoil} \quad (7c)$$

$$|X_2+M_A-M_B|\geq M_{spoil} \quad (7d)$$

$$|X_3+M_A+M_B|\geq M_{spoil} \quad (7e).$$

One special solution is as follows:

$$M_A=2M_{spoil} \quad (8a)$$

$$M_B=M_{spoil} \quad (8b).$$

Case 3: $M_0>M_1\geq M_0/2$:

$$|Y_1-M_A-2M_B|\geq M_{spoil} \quad (9a)$$

$$|X_0-M_B| \quad (9b)$$

$$|X_1+M_A|\geq M_{spoil} \quad (9c)$$

$$|X_2+M_A+M_B|\geq M_{spoil} \quad (9d)$$

$$|X_3+M_A+M_B|\geq M_{spoil} \quad (9e).$$

One special solution is as follows:

$$M_A=3M_{spoil} \quad (10a)$$

$$M_B=-M_{spoil} \quad (10b).$$

Case 4: $M_0/2>M_1\geq 0$:

$$|X_0-M_A-2M_B|\geq M_{spoil} \quad (11a)$$

$$|X_1-M_B|\geq M_{spoil} \quad (11b)$$

$$|X_2+M_A|\geq M_{spoil} \quad (11c)$$

$$|X_3+M_A-M_B|\geq M_{spoil} \quad (11d)$$

$$|X_4+M_A+M_B|\geq M_{spoil} \quad (11e).$$

One special solution is as follows:

$$M_A=3M_{spoil} \quad (12a)$$

$$M_B=-2M_{spoil} \quad (12b).$$

Case 5: $0>M_1$:

$$|X_0-M_A-2M_B|\geq M_{spoil} \quad (13a)$$

$$|X_1-M_B|\geq M_{spoil} \quad (13b)$$

$$|X_2+M_A|\geq M_{spoil} \quad (13c)$$

$$|X_3+M_A-M_B|M_{spoil} \quad (13d)$$

$$|Y_0+M_A+M_B|M_{spoil} \quad (13e).$$

One special solution is as follows:

$$M_A=M_{spoil} \quad (14a)$$

$$M_B=-2M_{spoil} \quad (14b).$$

It may be concluded from the following calculations that the special solutions 6, 8, 10, 12 and 14 are valid for each type of double spin-echo experiment and not restricted to diffusion measurements. Furthermore, no assumption is made regarding the temporal sequence of the RF pulses. Thirdly, no assumption is necessary with respect to the relationships between the existing gradient moments, the only gradient moment that counts is the one that refocuses the coherence of the double spin echo, i.e. the moments $M_0$ and $M_1$. Neither are there any assumptions with respect to the temporal length of the gradient pulses.

The above described a valid solution with finite dephasing moments for all possible parameter combinations. However, these special solutions described are not necessarily the best solutions, which means that, in dependence on the protocol/imaging parameters other solutions can exist, which place a lower requirement on the dephasing gradients.

With the above special solutions and assuming a maximum gradient amplitude $G_{spoil}$, which is possible for the dephasing gradients, it is possible to determine an upper limit for the required dephasing duration $t_A$ and $t_B$ directly.

$$t_A \leq 3 M_{spoil}/G_{spoil}$$

$$t_B \leq 2 M_{spoil}/G_{spoil}.$$

This information helps to reserve the necessary time required for the application of the dephasing gradients when the sequence is calculated during the establishment of the imaging sequence. The dephasing gradients do not necessarily have to be irradiated in pairs as shown in FIGS. 2 and 3, it is only necessary to ensure that the additional dephasing moments required are applied before the refocusing pulses, between and after the refocusing pulses. For the diffusion encoding, the two pairs of dephasing gradients minimize the undesired contribution to the diffusion weighting (b-value component), so that this implementation is a possible implementation. However, it can be advantageous for other applications to stretch the duration of the dephasing gradient to the maximal possible value in order to minimize the gradient load or in order to use an individual dephasing gradient pulse between two refocusing pulses.

FIG. 4 summarizes the steps for the determination of the dephasing gradients. In a first step 51, the imaging sequence at which the undesired signal coherence pathways are to be suppressed is determined. Step 51 also includes the determination of the desired imaging parameters, such as, for example, the echo time etc. Then, in step 52, the selected imaging sequence of the sequences of the preparation gradients is determined. With reference to FIG. 2 or 3, this means that the temporal sequence of the gradient moments $M_0$, $M_1$ and $M_2$ are defined. Then, in step 53, the desired signal coherence pathway and the undesired signal coherence pathways are determined such as obtained from equations 1a-1i. Then, in step 54, the dephasing gradients are determined in dependence on the gradient moments of the preparation gradients as described above in equations 2-16. If the dephasing gradients have been determined in order to suppress the undesired signal coherence pathways, the signal recording can be performed in step 55.

The above described method has the advantage that undesired signal coherence pathways are suppressed in each twice-refocused spin-echo experiment with any gradient moments before, between or after the two refocusing pulses with the achievement in full of the desired coherence pathway. Should the dephasing moment which is implicitly already present due to the preparation gradients be sufficient, no additional explicit dephasing gradients need to be switched. The above dephasing scheme enables the suppression of all undesired coherence pathways even when using dephasing gradients on only one gradient axis. If the corresponding dephasing gradients are applied simultaneously on all axes, either the dephasing efficiency can be increased or the dephasing moments required for each axis can be reduced. For the definition of an optimized dephasing scheme, it is sufficient to know the amplitudes and +/− signs of the gradient moments before, between or after the two refocusing pulses.

The maximal additional dephasing moment required is predefined and only depends on the desired reference dephasing moment, i.e. on $M_{spoil}$. The time period required for the dephasing gradients can then be taken fully into account in the sequence in advance. Depending upon the application, the additionally required dephasing gradient moment can, for example, be achieved by dephasing gradient pairs or by any other arrangements of gradient pulses.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquiring magnetic resonance (MR) signals, comprising:

from a control computer, operating an MR scanner, while a subject is situated in the MR scanner, to acquire the MR signals from the subject by executing a data acquisition sequence comprising a time interval in which a plurality of preparation gradients are activated for preparing the MR signals, followed by a readout segment in which readout gradients are activated for reading out the MR signals, and wherein said data acquisition sequence comprises radiation of radio frequency (RF) pulses that, when radiated, produce components of said MR signal having a desired signal coherence pathway and components of said MR signal having undesired signal coherence pathways, and in said readout segment, predominantly acquiring said MR signal components with said desired signal coherence pathway;

in said control computer, determining said MR signal components having said undesired signal coherence pathways in said data acquisition sequence;

from said control computer, operating said MR scanner in said data acquisition sequence to reduce acquisition of said MR signal components having said undesired signal coherence pathways by activating dephasing gradients dependent on said preparation gradients and dependent on the undesired signal coherence pathways, with said dephasing gradients having respective gradient moments that are determined in said control computer so that a dephasing gradient moment for each undesired signal coherence pathway is greater than a predetermined threshold value, and in said control computer, determining said dephasing gradients independently of said time interval and dependent only on an effective size of the respective gradient moments of said preparation gradients; and from said control computer, making the MR signals acquired with said data acquisition sequence in which said dephasing gradients were activated, available in electronic form as a data file.

2. The method as claimed in claim 1 comprising, from said control computer, operating said MR scanner with a double spin-echo sequence as said data acquisition sequence and, in said double spin-echo sequence, radiating one RF excitation pulse and two RF refocusing pulses and activating a first of said preparation gradients, with a first effective gradient moment, between the RF excitation pulse and a first of said two RF refocusing pulses, and activating at least a second of said preparation gradients, with a second effective gradient moment, between the two RF refocusing pulses and, in said control computer, determining said dephasing gradients dependent on a size of said first effective gradient moment relative to a size of said second effective gradient moment.

3. The method as claimed in claim 2 comprising, from said computer, activating said dephasing gradients with said second effective gradient moment more than twice as large as said first effective gradient moment.

4. The method as claimed in claim 2 comprising, from said control computer, operating said MR scanner to apply said dephasing gradients with said second effective gradient moment smaller than twice said first effective gradient moment.

5. The method as claimed in claim 2 comprising, from said control computer, operating said MR scanner to apply said dephasing gradients with said first effective gradient moment larger than said second effective gradient moment.

6. The method as claimed in claim 2 comprising, from said control computer, operating said MR scanner to apply said dephasing gradients with half of said first effective gradient moment larger than said second effective gradient moment.

7. The method as claimed in claim 2 comprising, from said control computer, operating said MR scanner to apply said dephasing gradients with said second effective gradient moment smaller than zero.

8. The method as claimed in claim 1 comprising, from said control computer, operating said MR scanner with a double spin-echo sequence as said data acquisition sequence and, in said double spin-echo sequence, radiating one RF excitation pulse and two RF refocusing pulses and activating a first of said preparation gradients, with a first effective gradient moment, between the RF excitation pulse and a first of said two RF refocusing pulses, and activating at least a second of said preparation gradients, with a second effective gradient moment, between the two RF refocusing pulses, and wherein a third of said preparation gradients, with a third effective gradient moment, is activated after a second of said two RF refocusing pulses and, in said control computer, determining said dephasing gradients dependent on a size of only two of said first, second and third effective gradient moments relative to each other.

9. The method as claimed in claim 8 comprising, from said computer, activating said dephasing gradients with said second effective gradient moment more than twice as large as said first effective gradient moment.

10. The method as claimed in claim 8 comprising, from said control computer, operating said MR scanner to apply said dephasing gradients with said second effective gradient moment smaller than twice said first effective gradient moment.

11. The method as claimed in claim 8 comprising, from said control computer, operating said MR scanner to apply said dephasing gradients with said first effective gradient moment larger than said second effective gradient moment.

12. The method as claimed in claim 8 comprising, from said control computer, operating said MR scanner to apply said dephasing gradients with half of said first effective gradient moment larger than said second effective gradient moment.

13. The method as claimed in claim 8 comprising, from said control computer, operating said MR scanner to apply said dephasing gradients with said second effective gradient moment smaller than zero.

14. The method as claimed in claim 8 comprising determining said dephasing gradients dependent only on a size of said first effective gradient moment relative to a size of said second effective gradient moment.

15. The method as claimed in claim 1 comprising, from said control computer, operating said MR scanner to apply one of said preparation gradients with a gradient moment produced by at least two chronologically separate gradients.

16. A magnetic resonance (MR) apparatus comprising:
an MR scanner;
a control computer configured to operate said MR scanner, while a subject is situated in the MR scanner, to acquire MR signals from the subject by executing a data acquisition sequence comprising a time interval in which a plurality of preparation gradients are activated for preparing the MR signals, followed by a readout segment in which readout gradients are activated for reading out the MR signals, and wherein said data acquisition sequence comprises radiation of radio frequency (RF) pulses that, when radiated, produce components of said MR signal having a desired signal coherence pathway and components of said MR signal having undesired signal coherence pathways, and in said readout segment, predominantly acquiring said MR signal components with said desired signal coherence pathway;
said control computer being configured to determine said MR signal components having said undesired signal coherence pathways in said data acquisition sequence;
said control computer being configured to operate said MR scanner in said data acquisition sequence to reduce acquisition of said MR signal components having said undesired signal coherence pathways by activating dephasing gradients dependent on said preparation gradients and dependent on the undesired signal coherence pathways, with said dephasing gradients having respective gradient moments that are determined in said control computer so that a dephasing gradient moment for each undesired signal coherence pathway is greater than a predetermined threshold value, and in said control computer, determining said dephasing gradients independently of said time interval and dependent only on an effective size of the respective gradient moments of said preparation gradients; and
said control computer being configured to make the MR signals acquired with said data acquisition sequence, in which said dephasing gradients were activated, available in electronic form as a data file.

* * * * *